Figure 1:
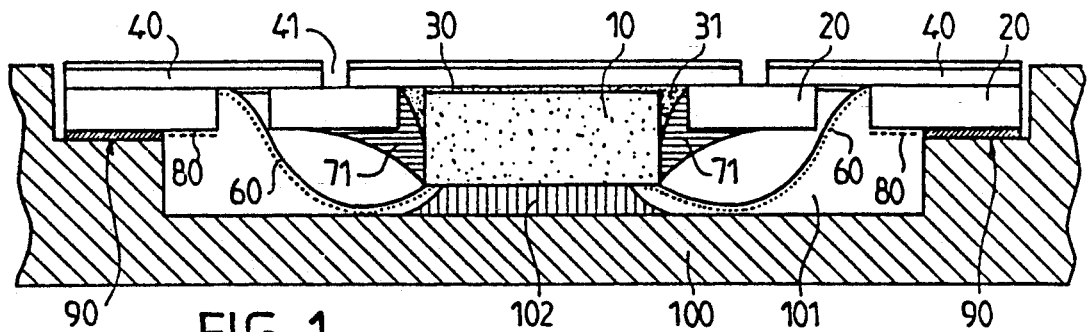

United States Patent [19]

Venambre

[11] Patent Number: 5,264,990
[45] Date of Patent: Nov. 23, 1993

[54] INTEGRATED CIRCUIT CARD THAT AIDS IN REDUCING STRESS ON AN INTEGRATED CIRCUIT

[75] Inventor: Jacques Venambre, Ifs-Plaine, France

[73] Assignee: U.S. Philips Corporation, New York, N.Y.

[21] Appl. No.: 697,842

[22] Filed: May 9, 1991

[30] Foreign Application Priority Data

May 11, 1990 [FR] France .................. 90 05917

[51] Int. Cl.⁵ .............................. H05K 1/18
[52] U.S. Cl. .................. 361/761; 235/488; 235/1 D; 361/728; 361/730; 361/749; 361/752; 361/760; 361/807; 361/809
[58] Field of Search ........... 361/398, 393, 400, 401, 361/392, 394, 417, 419, 420, 399, 417, 419, 420; 235/488, 489, 492, 1 D; 357/70, 80; 439/68, 457, 458; 257/679, 724, 922

[56] References Cited

U.S. PATENT DOCUMENTS

| | | | |
|---|---|---|---|
| 4,457,798 | 7/1984 | Hoppe et al. | 156/248 |
| 4,463,971 | 8/1984 | Hoppe et al. | 235/488 X |
| 4,649,418 | 3/1987 | Uden | 357/80 |
| 4,727,246 | 2/1988 | Hara et al. | 235/492 X |
| 4,764,803 | 8/1988 | Ueda | 357/72 |
| 4,792,843 | 12/1988 | Haghiri-Tehrahi et al. | 235/488 |
| 4,804,828 | 2/1989 | Oogita | 235/1 D |
| 4,822,989 | 4/1989 | Miyamoto et al. | 235/492 |
| 4,843,225 | 6/1989 | Hoppe | 357/79 X |
| 4,897,534 | 1/1990 | Hachiri-Tehrani | 235/488 |
| 4,994,659 | 2/1991 | Yabe et al. | 235/492 |
| 4,996,411 | 2/1991 | Redjock | 235/488 |
| 5,013,900 | 5/1991 | Hoppe | 235/492 |
| 5,097,117 | 3/1992 | Champagne et al. | 235/488 |

FOREIGN PATENT DOCUMENTS

| | | | |
|---|---|---|---|
| 0075890 | 4/1983 | European Pat. Off. | 439/68 |
| 163880 | 11/1985 | European Pat. Off. | |
| 2617668 | 6/1989 | France | |
| 58-141548 | 8/1983 | Japan | 357/70 |
| 59-117248 | 7/1984 | Japan | 357/70 |
| 63-179557 | 7/1988 | Japan | 357/70 |
| 64-1267 | 1/1989 | Japan | 357/70 |

*Primary Examiner*—Leo P. Picard
*Assistant Examiner*—D. Sparks
*Attorney, Agent, or Firm*—Paul R. Miller

[57] ABSTRACT

The invention relates to an integrated circuit card comprising a card support (130) which has a cavity (101) in which a vignette (200) is fixed, which vignette (200) comprises a circuit support (20, 40) and a circuit (10) arranged on a lower surface of the circuit support facing towards the interior of the cavity (101), the circuit (10) being positioned opposite a portion of a bottom (100) of the cavity (101). The bottom (100) has at least two weakenings (104) situated on either side of a bridge-portion (103) of the bottom.

14 Claims, 3 Drawing Sheets

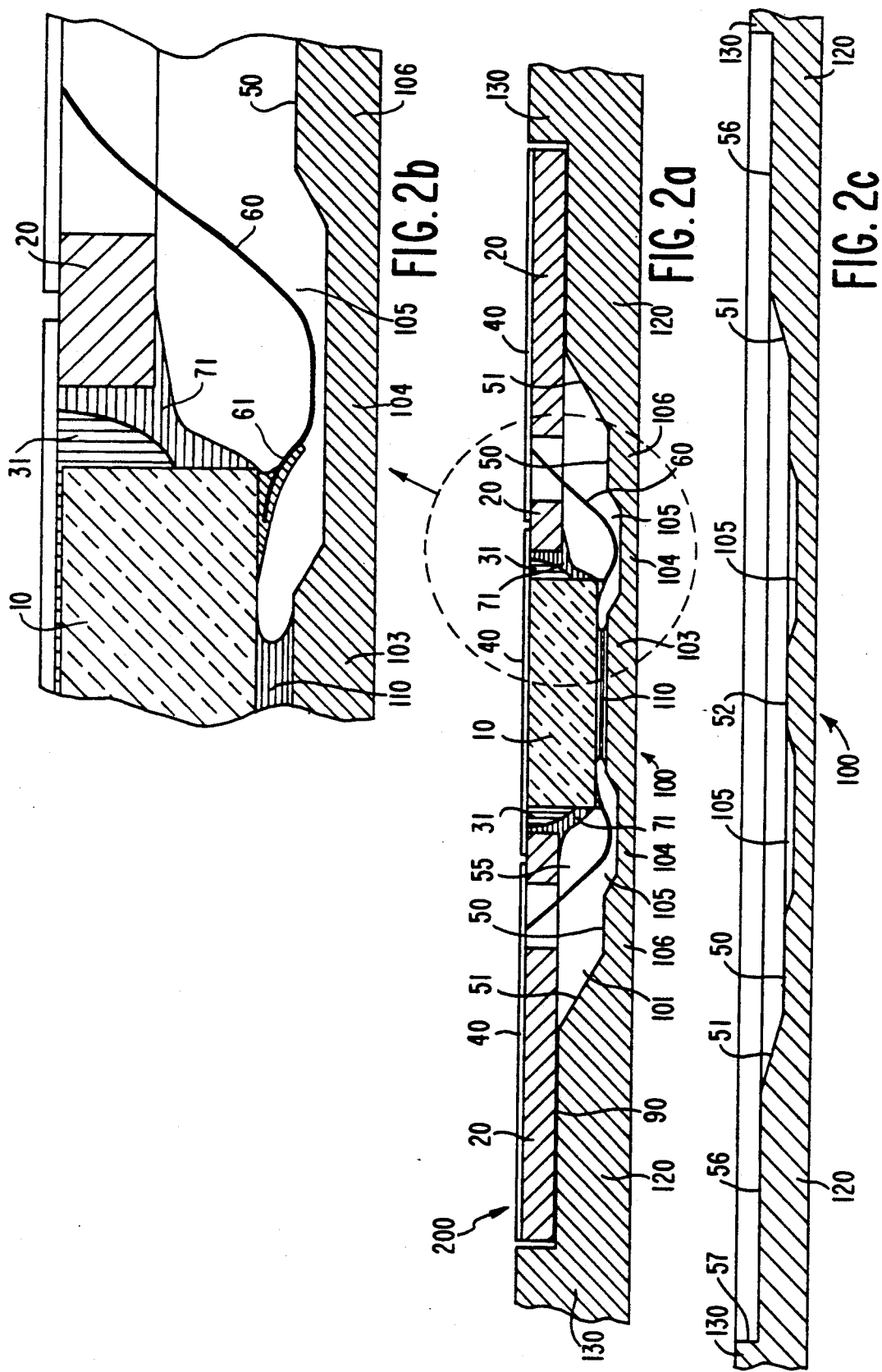

INTEGRATED CIRCUIT CARD THAT AIDS IN REDUCING STRESS ON AN INTEGRATED CIRCUIT

The invention relates to an integrated circuit card comprising a card support which has a cavity in which the integrated circuit is arranged and which has a weakening which is to prevent the transmission of mechanical stresses to the integrated circuit.

BACKGROUND OF THE INVENTION

Such a card is known from the prior EP 163880 (GAO Ges.), in which the weakening is arranged on the outside of the perimeter of the cavity in which the integrated circuit is arranged and within the overall thickness of the card. This solution is particularly suitable in the case of cards having three layers which are laminated together.

So-called "vignettes" are also known from the French Patent Application FR-A-2 617 668, filed Mar. 7, 1987. Retention and use of these cards imply mechanical stresses applied to the support of the card, which is flexible or semi-flexible, which stresses are retransmitted to the vignette and to the circuit which it carries.

The reliability of the integrated circuit cards of all types bears a direct relation to their capacity to resist the repeated application of such stresses without an adverse effect on its electrical properties (connections, wholeness of the circuit).

Therefore, mechanical resistance tests have been defined according to which an integrated circuit card should nominally be capable of withstanding one (or even several) thousand(s) of standardized longitudinal or transverse bending operations without deterioration. During such bending operations, and especially during bending operations caused by the application of forces parallel to a longitudinal direction of the card, the circuit is subjected to high stresses.

SUMMARY OF THE INVENTION

The present invention has for its object to improve the mechanical conditions relating to the retransmission of stresses to the integrated circuit, particularly during mechanical deformations of the card, and thus to increase the reliability of the card.

To achieve this object, the card support comprises at least two weakenings which constitute elastically deformable joints situated between on the one hand a bridge-portion forming a portion of a bottom of the cavity situated opposite the integrated circuit and on the other hand the remainder of the bottom.

Such weakenings, as will be shown in the ensuming description, form concentration points for the deformations, and the portion of the bottom of the cavity situated opposite the circuit forms a bridge-portion, which arrangement renders it possible to reduce the stresses to which the circuit is subjected. The weakenings are situated in the bottom of the card support and, accordingly, in contrast to the prior art according to the cited EP 163880, inside the perimeter of the cavity in a region which already has a reduced thickness relative to the total thickness of the card. As will be shown in the ensuing description, these weakenings render it possible for the bridge-portion thus mechanically disconnected from the remainder of the bottom to remain substantially plane locally which avoids to at least a considerable extent that the integrated circuit is subjected to bending stresses.

According to an embodiment, the weakenings extend in a longitudinal direction of the card away from the portion of the bottom of the cavity. This constitutes an improvement when stresses are applied in the longitudinal direction of the card.

The two weakenings may advantageously be disposed on either side of the bridge-portion. A symmetrical arrangement is thereby achieved with the circuit located substantially in a central portion of the cavity.

The weakenings may be bounded by a groove which may issue into the cavity. A preferred embodiment comprises at least one groove issuing into the cavity, while at least one connection wire of the circuit is arranged at least partly in a groove.

An integrated circuit card according to the invention may be of the type in which a magnetic strip overlaps the cavity at least partly. During reading and/or writing of such a card, the bridge-portion renders it possible to avoid that the mechanical deformations of the bottom are too strong, so that the contact between the head and the strip is sufficient to avoid an excessive attenuation of the signal at the level of the cavity ("drop out"). For example, when a roller rolls over the vignette, its deformations are only transmitted to the bridge-portion in as far as they exceed a certain threshold.

A resilient layer forming a spacer may be disposed between the circuit and the said portion of the bottom of the cavity. Such a coupling contributes to a diminishment of the mechanical deformations and a considerable diminishment of the transmission of stresses particularly dynamic stresses.

BRIEF DESCRIPTION OF THE DRAWING FIGURES

Figure 3A:
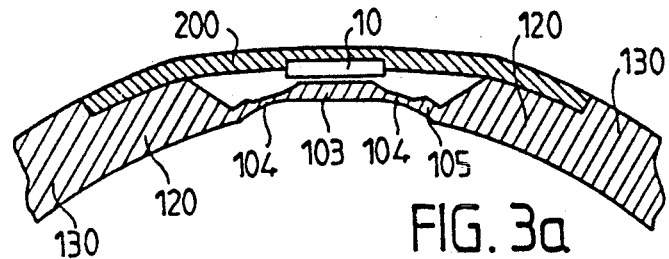
Figure 3B:
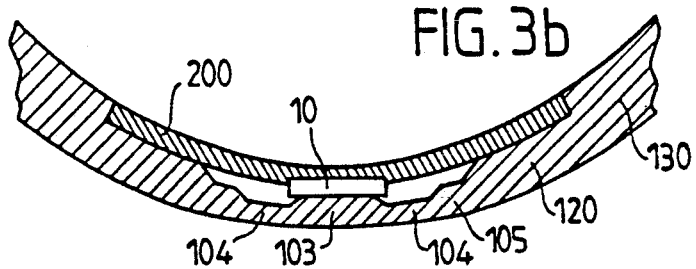
Figure 5:
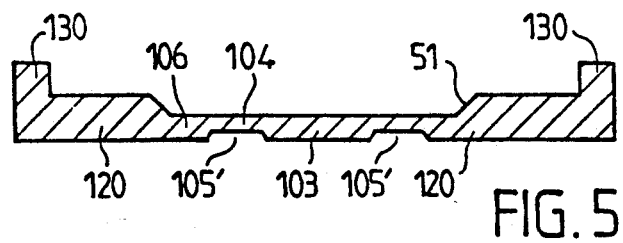
Figure 6:
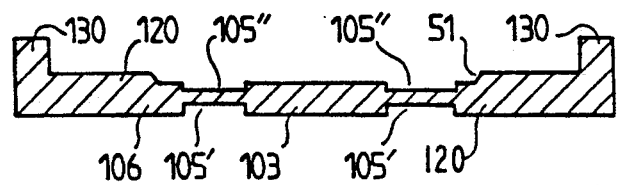
Figure 4A:
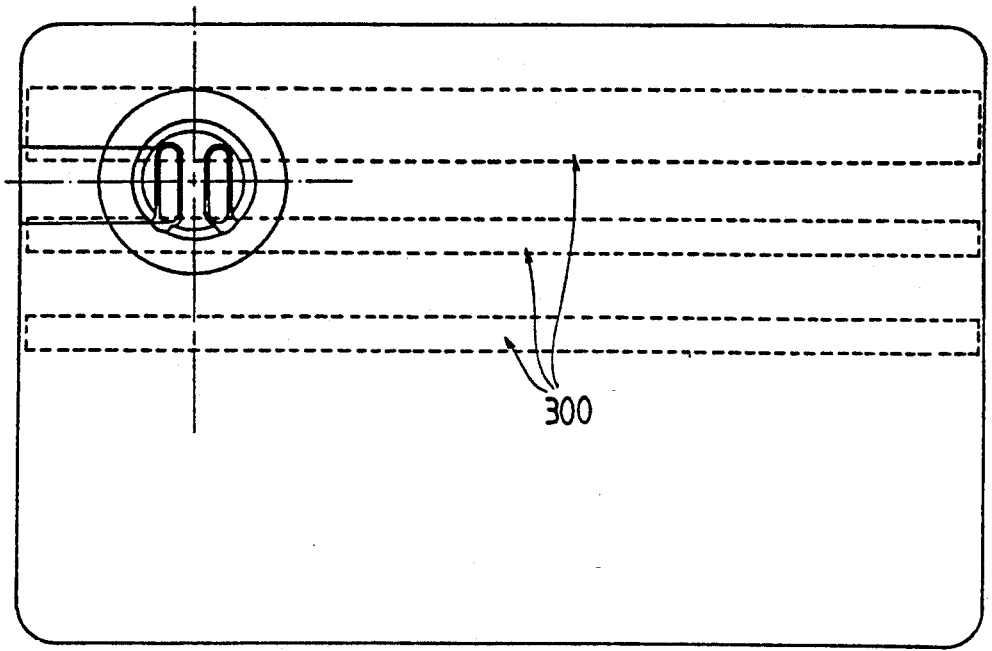
Figure 4B:
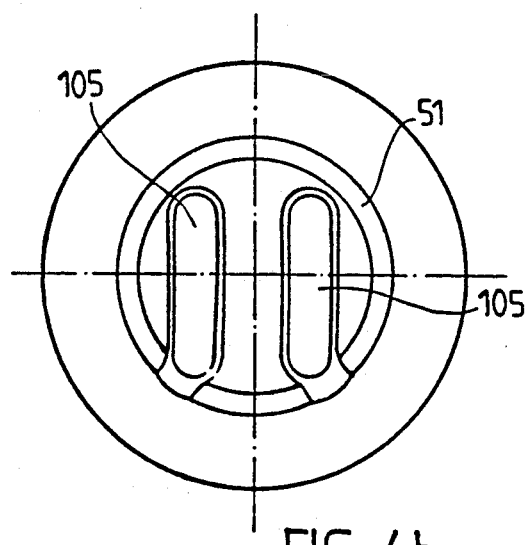

The invention will be better understood through reading of the following description which is given by way of example only, with reference to the annexed drawings in which:

FIG. 1 shows an integrated circuit card according to the cited prior art,

FIG. 2a represents a longitudinal section of an integrated circuit card according to a preferred embodiment of the invention, while FIG. 2b is a detail of FIG. 2a, and FIG. 2c shows the card support of FIG. 2b, FIGS. 3a and 3b illustrate the deformation states of a card according to the invention, FIG. 4a is a bottom view of a card support according to the invention, possibly provided with a magnetic strip or strips overlapping the cavity, and FIG. 4b is an enlarged view of the cavity of the card of FIG. 4a, and FIGS. 5 and 6 show modified versions of the invention.

DESCRIPTION OF THE INVENTION

According to FIG. 1, an integrated circuit card comprises a vignette which includes a circuit support 20, 40 and a circuit 10 and which is fixed in a cavity 101, the circuit 10 being arranged on a lower surface of the circuit support 20, 40 in such a way that the circuit 10 is arranged in the interior of the cavity 101 and lies opposite to the bottom 100 of the cavity 101. The circuit 10 is glued on the circuit support 20, 40 in conventional manner with a conductive glue 30, 31, and the connection wires 60 are soldered between the circuit 10 and the circuit support 20, 40, the latter comprising conductive layers arranged in such a manner as to realise the necessary connections. The circuit support here comprises a conductive layer 40 made of copper foil on which are deposited by electroplating a layer of Ni, then a layer of Au, and an insulating layer 20, the assembly forming a flexible support. The layer 40 comprises openings 41 which separate it electrically into different zones, which render it possible to insulate the electric contacting areas. Connection wires 60 are provided by ultrasonic means between the upper surface of the chip 10 and the zones. Zones 71 of epoxy resin having a progressive profile may be included for reinforcing the mechanical resistance. A more detailed description of this embodiment will be found in the French Patent Application FR 2 580 416, filed Dec. 4, 1985.

The vignette, which is obtained after cutting, is positioned and glued into the cavity 101 at 90. At 90, a double-face peel-off adhesive may be used according to the Patent Application FR 2 580 416 cited, whereby the peel-off layer may serve as a mask for a protective varnish 80.

Finally, an adhesion is realised at 102 by means of a layer of polyurethane resin, which is comparatively hard, so as to obtain a good mechanical rigidity of the assembly. Such a resin is, for example, DAMIVAL 13521 manufactured by ALSTHOM which has a hardness rating of 85 SHORE D2 after polymerization. The resins of the DAMIVAL family are considered by the manufacturerer as rigid at a hardness of 90 SHORE D2, semi-rigid at a hardness of 85 SHORE D2 (as above), and flexible at a hardness of 50 SHORE D2.

According to FIGS. 2a, 2b, 2c, the internal surface 50 of the bottom 100 of the cavity 101 of a card support 130 is grooved at 105, here with two grooves situated mainly on either side of the circuit 10 and defining two reduced thickness regions 104 which constitute the weakenings functioning as elastically deformable joints, while a bridge-portion 103 is left opposite a major portion of the circuit 10.

A slope 51 can be seen between the bottom 56 of the exterior contour joint 57 where the gluing 90 of the vignette 200 and the actual cavity 101 is effected. A slope 51 limits off the exterior of the cavity 101 and forms a transition between an external portion 106 of the bottom 100 and the region 120 of the card support 130 where the joint is made. A resilient layer 110 may be disposed between the circuit 10 and the internal surface 52 of the bridge-portion 103 of the bottom 100 of the cavity 101. Its function will be explained below. It will also be noted that the presence of the grooves 105 is utilized for absorbing at least partly the excess thickness of the wires 60 relative to the circuit 10 in the vicinity of the wire-soldering spot 61 on the main surface of the circuit 10 facing toward the bottom 100. This permits a space saving which is far from negligible. In fact, the central portion 103 opposite to circuit 10 is narrower than the bottom portion 100 (and thus narrower than the circuit 10) in order to leave a clearance around wire 60 in the vicinity of the soldered joint 61.

FIGS. 4a and 4b show in bottom view an embodiment of the grooves 105 which is obtained by milling. More particularly, magnetic strips 300 possibly disposed on the rear face of the card may overlap the cavity 101, which results in that a magnetic read/write device exerts a pressure on the vignette and/or the bottom 100 of the cavity during reading and/or writing of the card.

FIGS. 5 and 6, finally, show two modified versions of the invention. Grooves 105' may be disposed on the surface of the card support opposite to the cavity 101 (FIG. 5), or alternatively grooves 105' and 105'' may be disposed both on the internal surface of the cavity 101 and on the surface of the card support opposite to the cavity 101 (FIG. 6).

Referring more particularly to FIGS. 3a and 3b, it will now be explained what influence the weakenings 104 have during bending of the card.

In FIG. 3a, the vignette 200 is stretched out, and the internal surface 50 of the bottom 100 tends to lie flat against the circuit 10. The weakenings 104 fold and thus absorb a major portion of the deformations, which results in that the bridge-portion 103 either does not press against the circuit, or, in the case of a stronger bending of the card, presses against the circuit 10 but transmits thereto only a portion of the stresses owing to the fact that it remains substantially plane, the result being that the reliability of the card during repeated bending is increased. In the case shown in FIG. 3a, the function of the weakenings 104 is to serve as concentrating points for the deformations in order to avoid that the bridge-portion 103 transmits too high stresses to the circuit 10.

In fact, if submitted to a substantial bending, the bottom of the cavity would bear on the card by a reduced surface from which a concentration of the stresses, and a resulting high stress on the microcircuit would result.

In FIG. 3b, the vignette 200 is under compression and the circuit 10 will lie against the bridge-portion 103 which forms an abutment (or a beam) which is displaced by translation thanks to the weakenings 104 while remaining substantially plane. Owing to this, the stresses suffered by the circuit 10 are diminished, while the deformations of the bottom 100 of the cavity 101 are kept within reasonable limits. The abutment function of the bridge-portion 103 particularly renders possible a greater contact surface between it and the circuit 10, since the deformations are substantially absorbed by the weakenings 104, and the bridge-portion 103 remains relatively plane, so that, as above, a minimum stress is exerted on the integrated circuit. In practice, the bridge-portion 103 will be given the maximum thickness which is compatible with the tolerances on the card thickness and a surface equal to that of the circuit 10, except for a possible passage for the wires 60. It is of major interest to realise the weakenings 104 with the greatest possible width and the smallest possible thickness compatible with the repeated bending tests.

EXAMPLE

A credit card of polyvinyl chloride (PVC) charged with TiO$_2$, having an ISO standard rated length of 85.6 mm, a rated width of 53.98 mm and a rated thickness of 810 microns, has a cavity with an overall diameter of approximately 16.2 mm, the diameter at the bottom of the slope 51 being 12 mm. The bottom 50 of the cavity 101 has a thickness of 300 microns, the weakenings 104 have a thickness of 200 microns, a length of 6.9 mm and a width of 2.5 mm, while the bridge-portion 103 has a width of 2.5 mm. There is a rated tolerance of 50 microns between the circuit 10 and the bridge-portion 103.

The resilient layer 110, if present, may be realised in silicone RTV 3140 manufactured by DOW CORNING and having a hardness of 20 to 30 SHORE D2 depending on the vulcanizing conditions, especially as regards hygrometry. Using the classification criteria given above for the resins, the RTV 3140 could be qualified as "very flexible". It renders it possible to obtain a dynamic damping of the transmitted stresses between the circuit 10 and the bridge-portion 103 of the bottom 100, thus complementing the effect of the weakenings 104. The resilient layer 110 must not be too deformable, so that it can fulfil its damping function, but it must be sufficiently deformable in order to avoid the assembly becoming so rigid that it could transmit stresses to the integrated circuit. The optimum resilience of the layer 110 may be determined by means of bending tests.

A card according to the invention, but preferably with a resilient layer 110, has good properties as regards magnetic reading of magnetic strips partly overlapping the cavity 101. In that case, the bridge-portion 103 forms an abutment whose rigidity renders it possible to avoid major deformations which would lead to excessive attenuation ("drop out") of the signal. Since there is no rigid layer 102, as in FIG. 1, the deformations of the vignettes possibly caused by a roller rolling thereon during a magnetic read/write action are only transmitted to the bridge-portion 103 in as far as they exceed a certain threshold. It is particularly recommended to leave the smallest possible clearance between the circuit 10 and the bridge-portion 103 in order that the latter may be as thick as possible and thus as rigid as possible, which is also favourable in the case of the bending movements illustrated in FIGS. 3a and 3b.

The invention is not limited to the embodiments described and shown. The circuit 10 need not necessarily be placed at the center of the cavity 101, which may have shapes other than circular. A cavity 101 may have only one weakening 104, particularly in the case in which the circuit 10 adjoins an edge of the cavity. The grooves 105, 105' and 105'' may be realised, for example, by moulding.

I claim:

1. An integrated circuit card having weakening structure for preventing transmission of mechanical stresses to an integrated circuit comprising
    a card structure having internal means for supporting an integrated circuit,
    a cavity in said card structure surrounding said internal means,
    a bottom member of said card structure at said cavity, and
    at least two weakening means in said bottom member adjacent to said internal means for facilitating bending of said card structure with minimal mechanical stresses being applied to said integrated circuit.

2. An integrated circuit card according to claim 1, wherein said weakening means include thinned portions of said bottom member.

3. An integrated circuit card according to claim 1, wherein said weakening means include elastically deformable joints.

4. An integrated circuit card according to claim 1, wherein at least one of said weakening means is disposed at least one groove in said bottom member.

5. An integrated circuit card according to claim 4, wherein said at least one groove is disposed at each of said weakening means.

6. An integrated circuit card according to claim 4, wherein said at least one groove is disposed at an interior of said bottom member.

7. An integrated circuit card according to claim 4, wherein said at least one groove is disposed at an exterior of said bottom member.

8. An integrated circuit card according to claim 4, wherein said at least one groove is disposed at both an interior and an exterior of said bottom member.

9. An integrated circuit card according to claim 4, wherein at least one connection wire to said integrated circuit is disposed at least partially in said at least one groove.

10. An integrated circuit card according to claim 1, wherein a resilient spacer layer is disposed between said integrated circuit and said internal means.

11. An integrated circuit card according to claim 10, wherein said resilient spacer layer has a hardness lying between 20 and 30 SHORE D2.

12. An integrated circuit card according to claim 1, wherein at least one magnetic strip is disposed at least partially overlapping said cavity.

13. An integrated circuit card according to claim 1, wherein said weakening means enables said internal means and said integrated circuit to be maintained planar upon bending said card structure.

14. An integrated circuit card according to claim 1, wherein said weakening means mechanically disconnects said integral means from remaining portions of said bottom member.

* * * * *